United States Patent [19]

Beauducel et al.

[11] 4,352,070
[45] Sep. 28, 1982

[54] SAMPLE-AND-HOLD UNIT

[75] Inventors: Claude Beauducel, Henouville; Jacques Cretin, Le Chesnay, both of France

[73] Assignees: Institut Francais du Petrole, Rueil-Malmaison; Compagnie Generale de Geophysique, Massy, both of France

[21] Appl. No.: 137,100

[22] Filed: Apr. 4, 1980

[30] Foreign Application Priority Data

Apr. 6, 1979 [FR] France ............................. 79 08801

[51] Int. Cl.³ .......................................... G11C 27/02
[52] U.S. Cl. .................................. 328/151; 307/353; 328/162
[58] Field of Search ................ 307/352, 353; 328/151, 328/162, 165

[56] References Cited

U.S. PATENT DOCUMENTS

| 3,119,984 | 1/1964 | Brandt et al. | 328/151 |
| 3,654,560 | 4/1972 | Cath et al. | 328/162 |
| 3,820,033 | 6/1974 | Iwata | 328/151 |
| 3,961,205 | 6/1976 | Kuligowski et al. | 307/353 |

Primary Examiner—John Zazworsky
Attorney, Agent, or Firm—Millen & White

[57] ABSTRACT

This sample-and-hold unit comprises a capacitor for memorizing voltage samples and a passive compensation circuit, for substantially duplicate said voltage memorization, and adapted to compensate for a residual voltage after a first memorization by feeding back a portion of the duplicate memorized voltage.

5 Claims, 5 Drawing Figures

SAMPLE-AND-HOLD UNIT

BACKGROUND OF THE INVENTION

This invention relates to an improved sample-and-hold unit whereby the diaphony or crosstalk phenomenon between sequentially memorized signal samples can be reduced.

The sample-and-hold unit according to the invention is particularly adapted to memorize successive electric voltage samples within a very wide dynamic range of variations such as those produced, for example, by a multiplexer heading a seismic data acquisition chain.

For reasons which will be explained below, in the following description, the sample-and-hold units currently in use do not provide for the successive memorization of two samples without occurrence of interaction there between. Accordingly, the memorized value of a sample amplitude is not independent from the memorized value of the amplitude of the preceding sample. The separating power or capability of a sample-and-hold unit is defined as the rate of diaphony between successive samples. This rate never exceeds $-80$ dB whereas it would be necessary to obtain a rate of $-100$ dB for example in seismic acquisition chains.

A known method for overcoming the performance limitations of the sample-and-hold units presently in use, consists of omitting them and adapting the following part of the acquisition chain by taking into account the fact that the amplitude of the input signal is always changing. The multiplexer output is connected permanently to the sample amplifier, the amplitude of each sample, varies within the sampling period and, consequently, it is required that the gain program controlling the variation of the amplifier gain, take this variation into account so as to anticipate its probable variation. It thus becomes necessary to measure the signal derivative or the slope of its representing curve and to make use of a gain selection algorithm whereby said gain can be decreased. This algorithm is necessarily more complex than that usable in an acquisition chain comprising a sample memorizing element in which only a uniform gain increase is considered. Since said algorithm is operational in the form of an assembly of logic cabled elements, it results that the sample amplifier provided with such assembly is necessarily bulkier and consumes more power. These disadvantages are particularly troublesome when the data acquisition chain must be housed in a limited space not readily accessible, such as inside a seismic streamer.

SUMMARY OF THE INVENTION

The sample-and-hold unit according to the invention includes sample-and-hold means comprising a capacitor for memorizing voltage samples and means for charging the memorization capacitor with the voltage to be memorized during the sampling periods and for isolating the latter during the holding periods, a second capacitor having a first terminal connected intermittently to the output of the sample-and-hold means and a second terminal connected to ground and means for subtracting, from the voltage applied to the memorization capacitor, a portion of the voltage applied to the terminals of the second capacitor. More specifically, the invention comprises a passive compensation circuit comprising the second capacitor, and means to short-circuit intermittently the second capacitor, said passive compensation circuit being adapted to reproduce the actual operational characteristics of the memorizing capacitor.

The sample-and-hold unit according to the invention is adapted to reproduce and to compensate for phenomena occuring during the operation of a memorizing capacitor, and permits reducing to a large extent the interaction between the successively memorized voltages. As a consequence, the diaphony rate between successive samples substantially increases to reach a value of $-100$ dB compatible for use in a seismic acquisition chain, and the recourse to a logic gain control system of high performance can be avoided.

BRIEF DESCRIPTION OF THE DRAWINGS

Other features and advantages of the sample-and-hold unit according to the invention will become apparent from the following description of a preferred embodiment thereof, given with reference to the accompanying drawing wherein.

DETAILED DISCUSSION OF THE INVENTION

Figure 1:
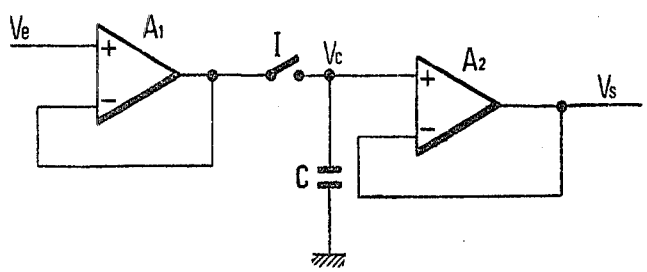
FIG. 1 diagrammatically shows a prior art sample-and-hold unit of a known type.
Figure 2:
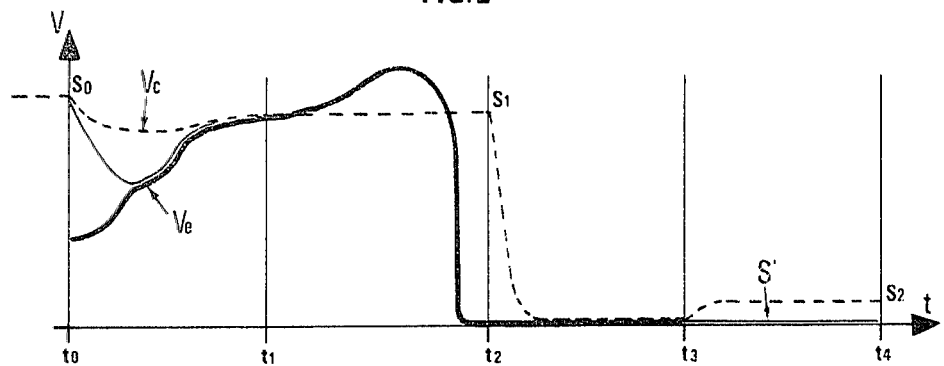
FIG. 2 is a graph showing curves of variations, over a period of time, of the input and output voltages of a sample-and-hold unit of a known type.

The sample-and-hold unit of a known type, illustrated in FIG. 1, comprises two operational amplifiers $A_1$ and $A_2$, arranged in series, the output of the first one is connected, through breaker I, preferably of electronic type, with the non-inverting input of the second amplifier $A_2$ which is also connected to ground through a capacitor C. The output impedance of the first amplifier $A_1$ is low, whereas the input impedance of the second is very high. The first amplifier $A_1$ is an isolating amplifier with a gain of one, whose output signal reproduces the signal $V_e$ applied to its non-inverting input. At instant $t_0$ where voltage $V_c$ to the terminals of the capacitor C is, for example, $S_0$ (FIG. 2), the electronic breaker I is switched on and the condensor C is rapidly charged or discharged (sampling period) so as to equalize voltage $V_c$ to the voltage $V_e$ at instant $t_1$ where the breaker is switched off. The input impedance of the amplifier $A_2$ being very high, the voltage $V_c$ remains practically constant over a second period called holding period and memorizes the value at instant $t_1$ of the sample. It is assumed that during the holding period $(t_1-t_2)$, the input signal $V_e$ has rapidly decreased down to a substantially zero value (wide dynamic of range). During the period $(t_2-t_3)$ where the electronic breaker I is again switched on (sampling period), the voltage $V_c$ decreases down also to a substantially zero value. However, at instant $t_3$ where again the breaker I is switched off, it is observed that the voltage $V_c$ and consequently, the voltage $V_s$ at the output of amplifier $A_2$, instead of keeping its substantially zero value $S'$ reached at the end of $t_2-t_3$ period, is subjected to an abrupt variation and takes an effective value $S_2$ which is proportional to amplitude $S_1$ memorized for the preceding sample.

This effect can be explained by the fact that the real capacitor C is equivalent (FIG. 3) to a theoretically leak-free capacitor $C_0$ connected in parallel with a branched line comprising a resistor or resistance $R_1$, and a capacitor of capacitance $C_1$ connected in series, the latter having a capitance substantially below that of $C_0$. When the voltage applied to the terminals of capacitor C substantially falls to zero (period $t_2-t_3$), capacitor $C_0$ is practically short-circuited and capacitor $C_1$ discharges through resistor $R_1$ with a time constant $R_1 C_1$ sufficiently high so as to retain a residual charge at instant $t_3$. When breaker I is again switched off (instant $t_3$), capacitor $C_1$ finally discharges and transfers to capacitor $C_0$ the residual charge. The residual charge appears on the terminals of capacitor $C_0$ as an error voltage $S_2$ which depends i.e., is proportional, on the charge stored by the capacitor during the holding period of the preceding sample and, consequently, of the charge voltage $S_1$.

The sample-and-hold unit according to the invention (FIG. 4) comprises, as that illustrated in FIG. 1, an isolating amplifier $A_1$ with a gain of one, receiving a signal $V_e$ at its non-inverting input E and whose output is connected, through a breaker $I_1$ preferably of electronic type to the non-inverting input of high impedance of a differential amplifier $A_2$. This same input is connected to the ground through a capacitor C for memorizing samples, represented in the Figure for the purpose of explaining its operation, by an equivalent circuit consisting of a leak-free capacitor $C_0$ connected in parallel to a branched line consisting of a capacitor $C_1$ connected in series with a resistor $R_1$ similar to the equivalency shown in FIG. 3.

The device of the invention differs from the prior devices in that it comprises a passive compensation circuit including three branched lines in parallel, a first one comprising a resistor of resistance $R_3$ connected in series with a capacitor of capacitance $C_3$, a second one including a capacitor $C_2$ and a third one an electronic breaker $I_3$. The passive compensation circuit has one of its ends connected to ground and its second end connected to the output of operational amplifier $A_2$ through a breaker $I_2$ preferably of the electronic type. The second end of the passive compensation circuit is also connected, ahead of the breaker $I_2$ to the non-inverting input of a third amplifier $A_3$ preferably having a gain of one, and whose output is connected to ground through a potentiometer $P_1$. The intermediate, i.e., sliding terminal of potentiometer $P_1$ is connected through a resistor $R_4$ to the inverting input of amplifier $A_2$, which is also connected to the output thereof through a resistor $R_5$. The values of the resistance of $R_3$ and the capacitance of $C_3$ are selected so that their product (time constant of the circuit) is substantially equal to $R_1 C_1$. Capacitor $C_2$ can be given a capacitance of any value, for example about of the same magnitude as that of $C_3$.

Figure 5:
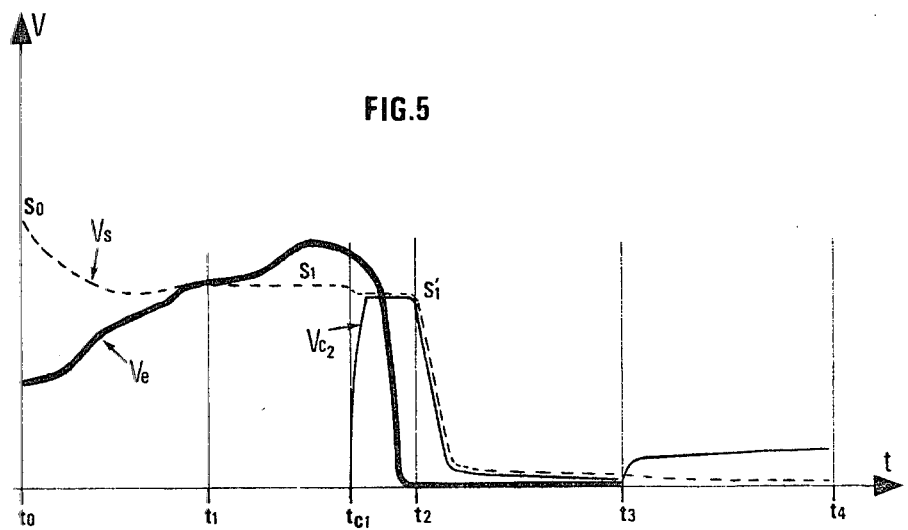
FIG. 5 is a graph showing curves of variation, over a period of time, of voltages at various points when using the device of FIG. 4.

The device operates as follows:

At instant $t_0$ (FIG. 5) breakers $I_1$ and $I_3$ are switched on while breaker $I_2$ remains in off position. Capacitor C is charged or discharged and the voltage at its terminals varies from an initial value $S_0$ to a value corresponding to that of the signal, and capacitor $C_2$ is discharged.

At instant $t_1$, the breakers $I_1$ and $I_3$ are switched off while maintaining in off position the breaker $I_2$ and the capacitor C memorizes the value $S_1$ of the voltage at its terminals, which is available at the output S of the sample-and-hold unit.

At instant $t_{c1}$, subsequent to $t_1$, breakers $I_1$ and $I_3$ are maintained in off position, breaker $I_2$ is switched on and the voltage $V_S$ is applied to the terminals of the passive circuit ($C_2$, $R_3$, $C_3$) resulting in the charge of capacitor $C_2$. As a consequence of the switching on of breaker $I_2$, a small portion of the output voltage of amplifier $A_2$ is applied to the inverting input thereof through an amplifier $A_3$ and potentiometer $P_1$ resulting in a slight change of the output voltage which passes from the value $S_1$ to a slightly lower value $S'_1$. This change is of no practical consequence as far as the holding period $(t_1-t_{c1})$ is sufficient for the elements following the acquisition chain to exploit the memorized value.

At a later instant $t_2$, the breaker $I_1$ is again switched on in order to proceed to a new sampling of the input signal. It is also assumed, to make more obvious the diaphony phenomenon, that, during the holding period $(t_1-t_2)$, the input signal has been subjected to an abrupt variation of level and that its amplitude has become very low. The voltage $V_c$ at terminals of capacitor C (and consequently the voltage $V_s$) varies again substantially up to the value of the input voltage $V_e$. The voltage at the terminals of capacitor $C_2$ will also follow the variations of voltage $V_s$.

At instant $t_3$ breaker $I_1$ as well as breaker $I_2$ is again switched off to memorize a new sample value. As above-explained, the residual charge of capacitor $C_1$ at instant $t_3$ is transferred through resistor $R_1$ to capacitor $C_0$ and generates, to the terminals thereof, an error voltage. However, during the same time, the breaker $I_3$ being in off position, the residual charge contained at instant $t_3$ in capacitor $C_3$ of the compensation passive circuit, discharges through resistor $R_3$ into capacitor $C_2$, thereby generating an error voltage, a fraction of which is fed back to the inverting input of amplifier $A_2$ through amplifier $A_3$ and potentiometer $P_1$. By a suitable control of potentiometer $P_1$, the voltage applied in counter-reaction can be so adjusted that it becomes substantially equal to the residual voltage introduced at the non-inverting input of amplifier $A_2$ and, consequently, nullifies the error voltage previously appearing at the output of the sample-and-hold units of a known type.

Figure 3:
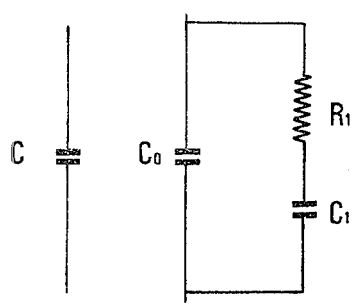
FIG. 3 shows an equivalent circuit to a real capacitor C.

To summarize, the preceding procedure consists of recreating, on the compensation passive circuit, the phenomena occurring in the operation of the memorizing capacitor C, i.e., as described with reference to the equivalent circuit of FIG. 3, and to subtract from one another the parasitic or residual voltages occurring, as a consequence of these phenomena, to the terminals of the capacitor and of the compensation passive circuit.

The sequence of operations is reproduced from instant $t_4$ when the breakers $I_1$ and $I_3$ are switched on, and breaker $I_2$ is maintained in off position.

Figure 4:
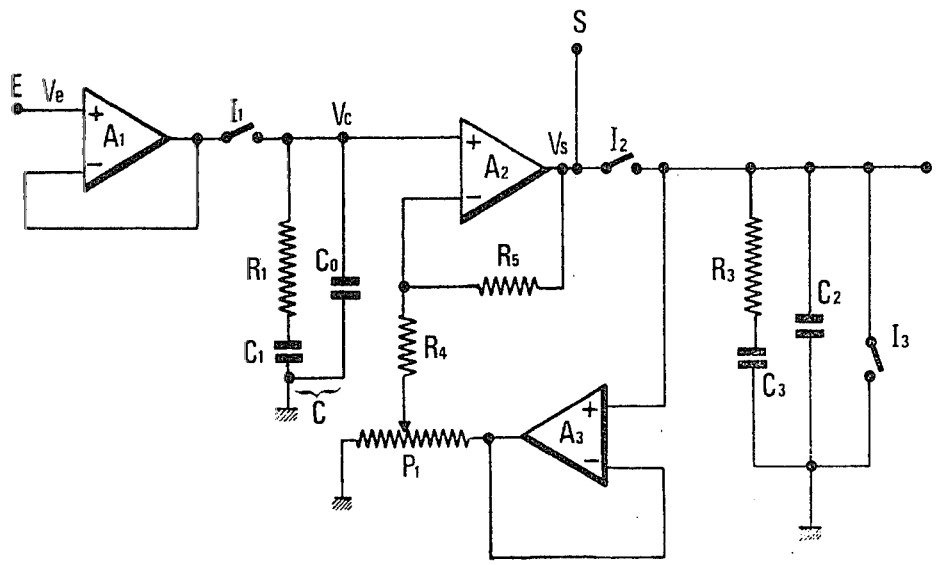
FIG. 4 shows a schematic diagram of the passive compensation device according to the invention associated with a sample-and-hold unit of a known type.

The invention can also include control means, as shown in FIG. 4 connected by dash lines to breakers $I_1$, $I_2$ and $I_3$, which is conventional in nature and adapted to alternatively or simultaneously switch on/off the breakers.

What is claimed is:

1. In a sample and hold circuit comprising sampling and holding means for receiving signals and temporarily storing said signals, and subsequently transmitting said stored signals, said sampling and holding means comprising capacitor means (C) for receiving and temporarily storing said signals, input means connectable to the capacitor means (C) for transmitting and charging said capacitor means (C) with said signals, and output means connected to the capacitor means (C) for transmitting the signals stored in the capacitor means (C) for readout, the improvement which comprises:

compensating means for compensating for parasitic voltages delivered by said sampling and holding means resulting from diaphony between successive samples having different amplitudes, said compensating means comprising;

(a) a passive compensation circuit including a capacitor ($C_2$), intermittently connected to the output of said sampling and holding means, and connected to ground, and said passive compensation circuit adapted to reproduce the operational characteristics of said capacitor means (C), (b) first breaker means ($I_2$) connected between the output of said sampling and holding means and said passive compensation circuit for intermittently connecting said passive compensation circuit to the output of said sampling and holding means, and second breaker means ($I_3$) operatively associated with said passive compensation circuit for intermittently short-circuiting said passive compensation circuit, and said first and second breaker means adapted for being sequentially actuated, and (c) subtracting means operatively associated with said passive compensation circuit, and with said sampling and holding means, for subtracting from the voltages stored in capacitor means (C) a fraction of a signal stored in capacitor ($C_2$) to thereby compensate for the parasitic voltages appearing at the output of said sampling and holding means resulting from diaphony between successive samples transmitted through said sampling and holding means.

2. A sample-and-hold circuit according to claim 1, wherein said capacitor means (C) is selected to be equivalent to a circuit comprising a first capacitor ($C_0$) connected in parallel to a first branched circuit consisting of a second capacitor ($C_1$) and a first resistor ($R_1$) connected in series, and wherein said passive compensation circuit further comprises a circuit, connected in parallel to said capacitor ($C_2$), comprising a second resistor ($R_3$) and a third capacitor ($C_3$) connected in series and having a time charge constant through the second resistor ($R_3$) substantially equal to that of the second capacitor ($C_1$) of said first branched circuit of said equivalent circuit.

3. A sample-and-hold circuit according to claim 2 wherein said sampling and holding means comprises output amplifying means ($A_2$) operatively associated with said capacitor means (C) for amplifying the voltage received from the capacitor means (C), and wherein said subtracting comprises an amplifying circuit ($A_3$) and means for applying a portion of the output voltage of the amplifying circuit ($A_3$) in inverted form to the input of said amplifying means ($A_2$).

4. A sample-and-hold circuit according to claim 3, wherein said sampling and holding means comprises input means comprising an amplifier ($A_1$) having a gain of one, having its output connected to the capacitor means (C) through a third breaker means ($I_1$), and wherein the received signals are applied to the input of said amplifier ($A_1$).

5. A sample-and-hold circuit according to claim 2 wherein said sampling and holding means comprises input means comprising third breaker means ($I_1$), and wherein said sample-and-hold circuit further comprises control means adapted for actuating said first, second and third breaker means ($I_1$), ($I_2$), ($I_3$).

* * * * *